United States Patent [19]

Wheatley, Jr.

[11] 4,045,746
[45] Aug. 30, 1977

[54] ADJUSTABLE GAIN CURRENT AMPLIFIERS

[75] Inventor: Carl Franklin Wheatley, Jr., Somerset, N.J.

[73] Assignee: RCA Corporation, New York, N.Y.

[21] Appl. No.: 688,575

[22] Filed: May 21, 1976

[51] Int. Cl.² .......................... H03F 1/32; H03F 3/45
[52] U.S. Cl. ...................................... 330/23; 330/22; 330/26; 330/29; 330/30 D
[58] Field of Search ................ 323/4; 330/18, 19, 22, 330/23, 40, 26, 29, 30 D

[56] References Cited

U.S. PATENT DOCUMENTS

| 3,660,694 | 5/1972 | Lucas | 330/22 X |
| 3,825,778 | 7/1974 | Ahmed | 323/4 X |

Primary Examiner—Lawrence J. Dahl
Attorney, Agent, or Firm—H. Christoffersen; S. Cohen; A. L. Limberg

[57] ABSTRACT

The current gain of a current mirror amplifier (CMA) is trimmed by applying an adjustable potential difference between the base-emitter potentials of first and second transistors of the CMA, this potential difference being substantially linearly proportional to the absolute temperature at which the first and second transistors are operated. The resultant trim maintains itself over a wide range of temperature.

9 Claims, 6 Drawing Figures

ADJUSTABLE GAIN CURRENT AMPLIFIERS

The present invention relates to adjusting or trimming the current gain of current mirror amplifiers.

The current gain of a current mirror amplifier (CMA) is determined by the ratio of the effective transconductances of first and second transistors. CMA's can be made using matched first and second transistors to obtain a current gain which is nominally minus unity. Such CMA's are often used in monolithic integrated-circuit (IC) operational amplifiers, serving as balanced-to-single-ended signal converters to differentially combine currents from a preceding differential amplifier input stage. In this use, it is desirable to be able to trim the current gain of the CMA so that a direct-coupled feedback loop around the operational amplifier will adjust the relative quiescent currents in the transistors of the input differential amplifier to achieve zero quiescent offset potential error between their input electrodes.

A prior art practice has been to use a potentiometer to introduce adjustable amounts of emitter degeneration resistance into the emitter circuits of the first and second transistors in the CMA, or of transistors parallelling them, to affect the relative effective transconductances of the first and second transistors and, thus, the current gain of the CMA. These adjustment methods tend to provide an adequate trim only near certain operating temperatures for operational amplifier and potentiometer, however.

U.S. Pat. No. 3,868,581, issued Feb. 25, 1975, to A.A.A. Ahmed and entitled "Current Amplifier" teaches that the current gain of a CMA can be altered by introducing a potential offset between the base-emitter potentials of the first and second transistors. Further, if the potential offset is proportional to the absolute temperature T at which the first and second transistors are operated, the altered current gain will not change with temperature. The method of providing this potential offset described by Ahmed does not lend itself to adjustment of the potential offset, however.

The present invention contemplates trimming or adjusting the current gain of a current mirror amplifier adequately over a relatively wide range of operating temperatures as compared to the prior art, by providing means for applying a programmable potential difference between the base-emitter potentials of its first and second transistors, which potential difference is substantially linearly proportional to the absolute temperature T at which the first and second transistors are operated.

The present invention is generic to the programming of the potential difference in accordance with a continuous function—e.g., analog programming, as specifically described and claimed in my concurrently filed United States applications Ser. Nos. 688,578 and 688,589, each entitled "Transistor Amplifiers" and digital programming as described herein. Digital programming simplifies providing for temperature-compensated adjustments of CMA gain, since all the significant current gain determining elements can be located within the confines of a single monolithic integrated circuit and thus share the same thermal environment.

Figure 1:
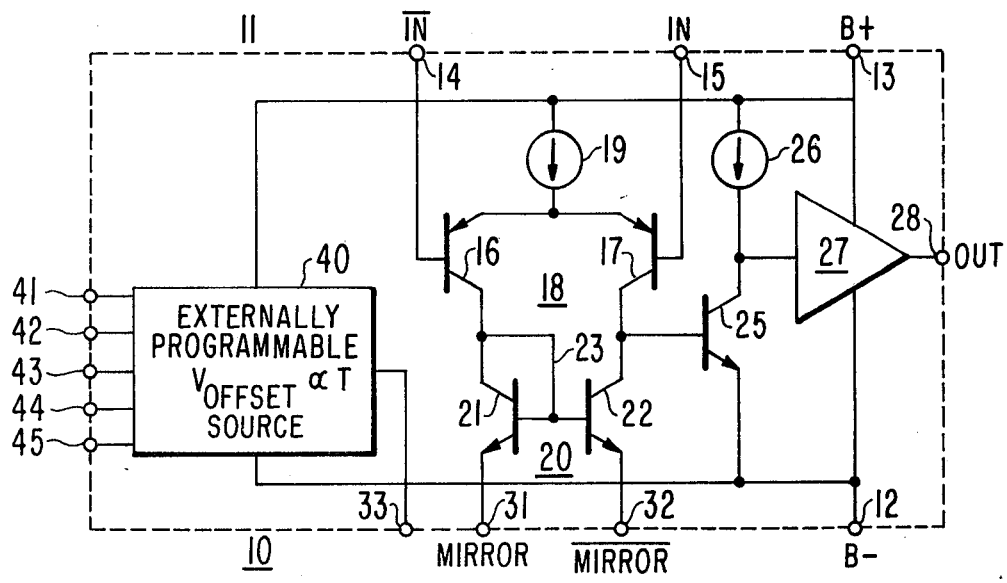
FIG. 1 is a schematic diagram, partially in block form of an integrated operational amplifier embodying the invention.

More particularly, FIG. 1 shows an operational amplifier 10 constructed within the confines (indicated by the dotted line boundary 11) of a monolithic integrated circuit. This circuit is provided terminals 12 and 13 for the application of relatively negative B− and relatively positive B+ operating potentials. Inverting input terminal 14 and non-inverting terminal 15 are at the respective base electrodes of transistors 16 and 17 connected as an emitter-coupled differential amplifier 18 used as the input stage of operational amplifier 10. The emitter electrodes of transistors 16 and 17 are connected to a constant-current source 19 supplying them combined emitter currents. The collector currents of transistors 16 and 17 are applied to the input and output terminals, respectively, of a CMA 20 which acts as a balanced-to-single-ended signal converter inverting the push-pull variations in the collector currents of transistors 16 and 17 to a single-ended signal current applied to the base electrode of transistor 25. Transistor 25 is a common-emitter amplifier transistor included in the intermediate amplification stage of the operational amplifier 10. Constant-current source 26 provides an active collector load for transistor 25, and the signal appearing at the collector electrode of transistor 25 responsive to the signal current applied to its base electrode is applied to the input of a single power amlifier stage 27. The response of the power amplifier 27 is applied via output terminal 28 to the environment outside the monolithic IC.

CMA 20 includes a transistor 21 having a direct-coupled collector-to-base feedback connection, shown in FIG. 1 as a direct connection 23, that adjusts its base potential to condition it for conducting a collector current equal to the collector current supplied by transistor 16 less the relatively small base currents of transistors 21 and 22. Assuming the emitter potentials of transistors 21 and 22 to be equal, their equal base potentials would condition transistors 21 and 22 for respective collector currents in the same ratio to each other as their respective transconductances. Assuming transistors 21 and 22 to have similar diffusion profiles, their respective transconductances would be related in the same ratio as the respective effective areas of their respective base-emitter junctions. To carry out balanced-to-single-ended signal conversion it is usually desired that the current gain of CMA 20 as between the collector electrodes of transistors 21 and 22 be minus unity, in which case transistors 21 and 22 are made with respective base-emitter junctions of equal effective area.

CMA 20 differs from the prior art CMA prototype in that the emitter electrodes of transistors 21 and 22 are not simply connected to B− terminal 12, but rather to terminals 31 and 32, respectively. In operation, at least one of terminals 31 and 32 is connected to terminal 12, but the other, whenever there is need for corrective trimming of the current gain of CMA 20, is connected to terminal 33. There, it receives a potential which is offset from the B− potential on terminal 12. This offset potential, supplied from a source 40 is linearly proportional to the absolute temperature T at which transistors 21 and 22 are operated, causes $V_{BE22}$ to differ from $V_{BE21}$ by an amount $\Delta V$. The magnitude of $\Delta V$, $[\Delta V]$, is externally programmed by the selective connection of terminals 41, 42, 43, 44 and 45 to one of the others or to one of supply terminals 12 or 13.

Proceeding from the following well-known equation descriptive of transistor operation, one can develop a feeling for the magnitudes of ΔV to be expected.

$$V_{BE} = (kT/q)ln(I_C/I_S) \quad (1)$$

where:
  $V_{BE}$ is the base-emitter potential of the transistor,
  $k$ is Boltzmann's constant,
  $T$ is the absolute temperature at which the transistor is operated,
  $q$ is the charge on an electron,
  $I_C$ is the transistor collector current, and
  $I_S$ is the value of $I_C$ for $V_{BE} = 0$.

Transistors 21 and 22 are assumed (owing to their construction within the confines of the same monolithic IC) to be operated at the same T and to have $I_S$'s in the same ratio as the effective areas of their respective base-emitter junctions—i.e., equal $I_S$'s where CMA 20 has a nominal current gain of $-1$. $V_{BE}$ and $I_C$ will be subscripted with the identification numeral of the transistor to which it refers. Base current effects upon gain will be considered negligible, so the current gain of CMA 20 can be simply expressed as $I_{C22}/I_{C21}$.

$$\Delta V = V_{BE22} - V_{BE21} = (kT/q)ln(I_{C22}/I_S) - (kT/q)ln(I_{C21}/I_S) = (kT/q)ln(I_{C22}/I_{21}) \quad (2)$$

In the normal operating temperature range of a transistor, around 350° K, kT/q has a value such that the operation conforms substantially with the following table.

| ΔV in mV | −2.7 | −1.3 | −0.5 | −0.24 | −0.12 | 0 | +0.12 | +0.24 | −0.5 | +1.3 | +2.5 |
|---|---|---|---|---|---|---|---|---|---|---|---|
| $I_{C22}/I_{C21}$ | 0.90 | 0.95 | 0.98 | 0.99 | 0.995 | 1 | 1.005 | 1.01 | 1.02 | 1.05 | 1.10 |

Correction of the current gain of CMA 20 by more than a few per cent is seldom necessary, and ΔV's of 2.5 millivolts or less are all that one would expect to be required.

Figure 2:
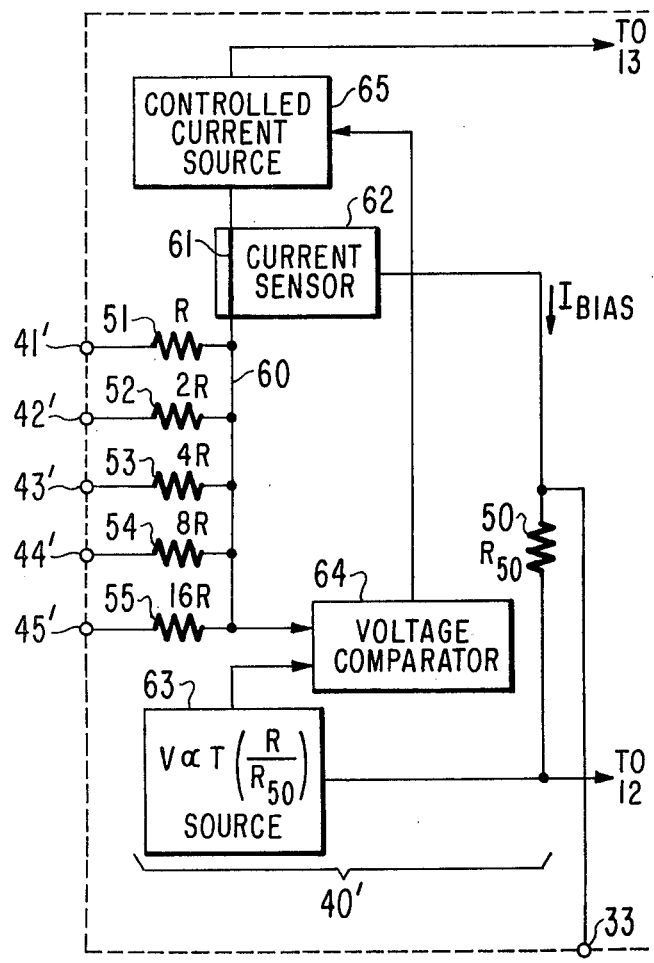
FIGS. 2 and 3 are schematic diagrams, partially in block form, of alternative forms of block 40 of FIG. 1.
Figure 3:
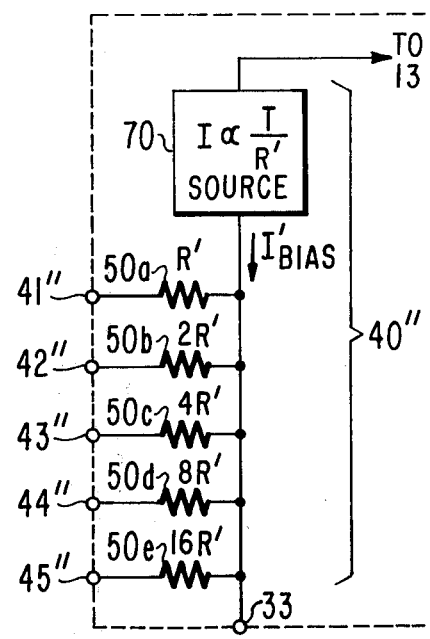

The ΔV potential for application between the emitter electrodes of transistors 21 and 22 can be developed across a resistive element responsive to application of a current substantially greater than the emitter currents of transistors 21 and 22. In such case, the resistive element will, in view of the small ΔV potentials to be expected, be of such low resistance as to provide negligible emitter degeneration to transistor 21 or 22. The internal emitter resistance of a transistor at 350° K is known to be $(30/I_E)$ ohms while $I_E$ is emitter current in milliamperes, while the resistance of the resistive element is about the 2 millivolt desired drop divided by a current in milliamperes substantially larger than $I_E$—that is, substantially smaller than $2/I_E$. FIGS. 2 and 3 show two types of programmable voltage sources 40' and 40".

In FIG. 2, resistor 50 is available for connection between terminals 31 and 32 (the emitter electrodes of transistors 21 and 22), one of these terminals 32 being connected to B− terminal 12. Resistor 50 is operated at a temperature substantially equal to T and has a resistance $R_{50}$ that may exhibit dependence upon T. The adjustment of the offset voltage between the emitter electrodes of the CMA transistors is controlled by the resistor networks 51-55. By connecting selected ones of terminals 41', 42', 43', 44' and 45' to B− terminal 12, a particular current $I_{BIAS}$ may be made to flow through resistor 50 to thereby cause a particular offset voltage to be developed. The $I_{BIAS}$ selection occurs in discrete steps, the five resistors illustrated permitting the selection of one of thirty-two different values of $J_{BIAS}$.

Resistors 51-55 are operated at a temperature substantially equal to T and have resistances that are proportional to each other and may exhibit dependence on T, the resistance of the lowest-resistance resistor 51 being R. If it is desired to change the current gain of CMA 20 in equal percentage steps, the respective resistances of 51, 52, 53, 54 and 55 may have values R, 2R, 4R, 8R and 16R, respectively, as shown. Other alternative forms of series or parallel resistive networks are, of course, possible and within the scope of the present invention, and may be used for providing discrete current steps related to one another in other ways, linear or non-linear, as desired.

Means are provided for regulating the potential between terminal 12 and connection 60. This potential is regulated to a value proportional to $T(R/R_{50})$ to cause a combined current flow through such of resistors 51-54 that have their first ends connected to terminal 12 proportional to $T/R_{50}$. This combined current flows through the low-impedance input circuit 61 of a current sensor 62 that responds with an output current $I_{BIAS}$, which output current is also proportional to $T/R_{50}$ and is applied to resistor 50 to cause the desired potential drop proportional to T thereacross.

This voltage regulation may be described more particularly as follows. The potential on connection 60 and a potential V proportional to $TR/R_{50}$ as supplied by source 63 are compared against each other in a voltage comparator 64 to develop a control signal indicative of the difference between them. This control signal is applied to controlled current source 65 to control the current supplied to connection 60 through the series connection of source 65 and the input circuit 61 of current sensor 62. This completes a degenerative feedback loop that reduces the flow of current to connection 60, which is then apportioned to such of resistors 51-54 as have their first ends connected to terminal 12, so that the potential at connection 60 is substantially equal to V.

FIG. 3 shows a programmable voltage source 40" which comprises a number of resistors 50a, 50b, 50c, 50d, 50e operated at a temperature substantially equal to T and suited for selective connection singly or parallelly between the emitter electrodes of transistors 21 and 22 to receive a combined current $I'_{BIAS}$ from a current source 70. $I'_{BIAS}$ is proportional to $T/R'$. R' is the resistance of the lower-resistance resistor 50a and may exhibit dependency on T. Resistors 50b-50e have resistances proportional to R'. Accordingly, the offset potential between the emitter electrodes of transistors 21 and 22 will be proportional to T. $I'_{BIAS}$ may be provided by apparatus similar to that used to supply $I_{BIAS}$ in FIG. 2 or modified to have only a single resistor in fixed connection between connection 60 and terminal 12.

Figure 4:
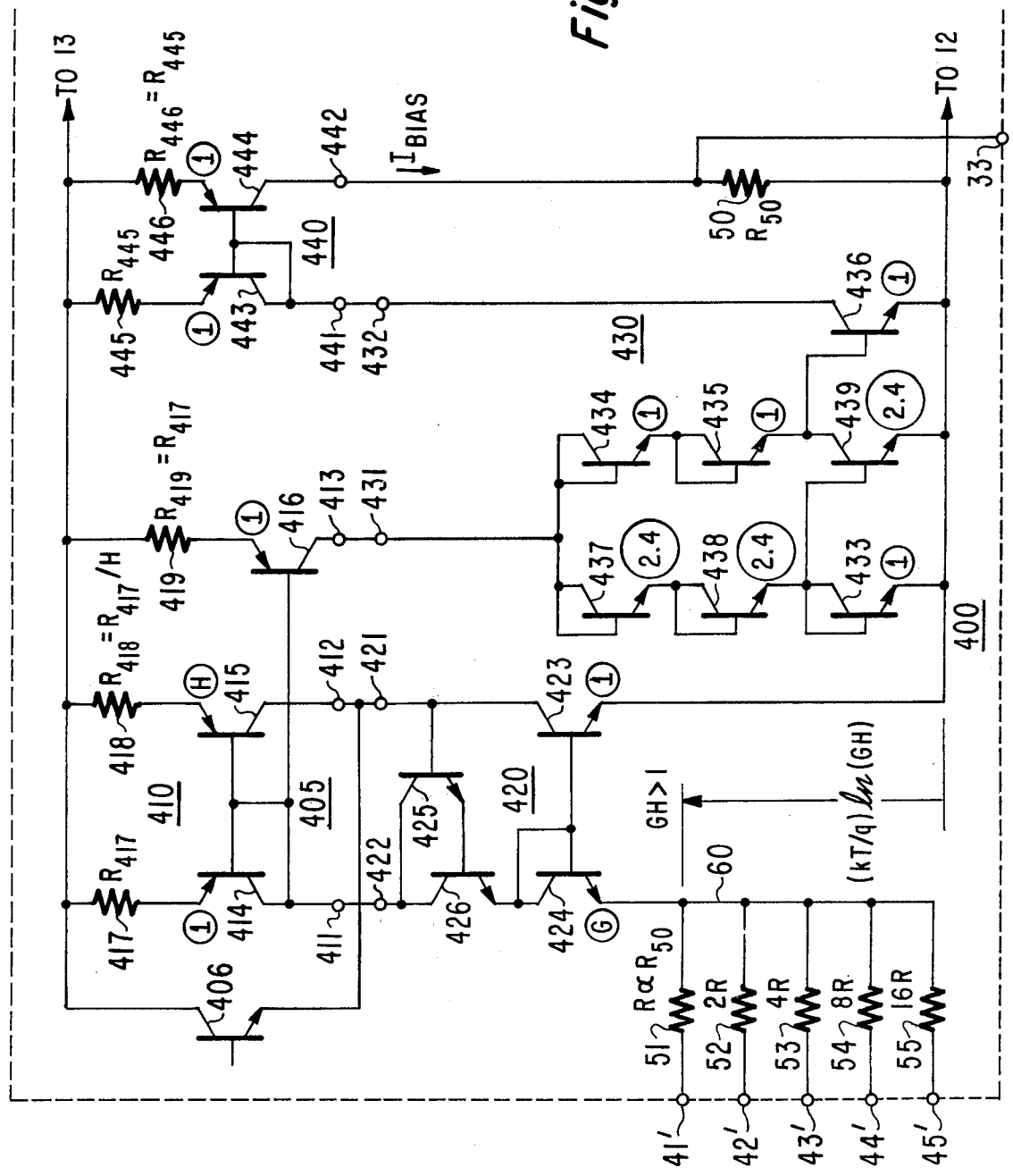
FIGS. 4 and 5 are schematic diagrams showing details of the circuits of FIGS. 2 and 3, repsectively.

FIG. 4 shows a specific programmable voltage source 400 of the type 40' shown more generally in FIG. 2. In source 400, R is made proportional to $R_{50}$. This is done by making all of resistors 50, 51, 52, 53, 54 and 55 by the same process steps. This avoids any problem of having to track the differing temperature coefficients of differing types of resistors. Current regulating circuit 405, of the type described by the present inventor in U.S. Pat. No. 3,629,691 entitled "Current Source" and issued 21 Dec. 1971, comprises a regenerative feedback loop connection of (a) a first current amplifier with input and output terminals 411 and 412 and (b) a second current amplifier 420 with input and output terminals 421 and 422. Regeneration is initiated in the loop by the leakage current through the collector-to-emitter path of open-base transistor 406. The first current amplifier is a portion of a dual-output CMA 410 having a master transistor 414 provided with collector-to-base feedback to adjust its base potential to condition it to supply collector current substantially equal to that demanded at terminal 411 and having slave transistors 415 and 416 receiving similar base potential. Transistors 414, 415 and 416 have respective transconductances in 1:H:1 ratio and resistors 417, 418 and 419 have respective resistances $R_{417}$, $R_{418}$ and $R_{419}$ in 1:(1/H):1 ratio (e.g., as determined by the effective areas of their respective base-emitter junctions). So, the amplifier 410 exhibits current gains between its input terminal 411 and each of its output terminals 412 and 413 of $-H$ and $-1$, respectively. The second current amplifier comprises transistors 423, 424, 425 and 426 in a configuration that were the emitter electrodes of transistors 423 and 424 directly connected would be a well-known type of current mirror amplifier with a current gain of $-G$ owing to the transconductances of transistors 423 and 424 (e.g., as determined by the effective areas of their respective base-emitter junctions) being in 1 to G ratio for equal base-emitter voltages. At very low levels of input current to amplifier 420 current gain of $-G$ is obtained. However, since GH is made greater than one, current levels build up in the regenerative feedback loop. At increasing levels the resistance of such resistors 51-55 as are connected between the emitter electrodes of transistors 423 and 424 reduces the current gain of amplifier 420 until at equilibrium it equals $-1/H$. It can be shown that the emitter potentials of transistors 423 and 424 differ by a potential equal to $(kT/q)lnGH$.

The currents flowing through the principal conduction paths of transistors 414, 426, 424 and the emitter degeneration resistance of transistor 424 are substantially the same. Accordingly, dual-output current mirror amplifier 410 acts as a sensor for current flow through such of resistive elements 51-55 as are connected to terminal 12, supplying a like-valued current from its output terminal 413. While one could choose GH to be so close to unity that the current provided at terminal 413 could be used directly as $I_{BIAS}$ for application to resistor 50, this presents problems of manufacturing reproducibility. Better design procedure is to choose GH a few times larger than 1 so positive regeneration is initially strong in the regulator loop, helping to assure starting, so that internal emitter resistance of transistors 423 and 424 affect the potential developed at connection 60 less, and so tolerances of G and H are somewhat looser, and then to divide down the current supplied from terminal 413. For example, choosing H = 1, G = 4 will cause a 36 millivolt offset between the emitter electrodes of transistors 423 and 424. To track resistive elements 50-55 in resistance, it is most convenient to make $4R = R_{50}$. Paralleling all of resistive elements 51-55 will result in a resistance of $16R/31 = 4R_{50}/31$, so the current through them will be, by Ohm's Law, the 36mv offset divided by $4R_{50}$—i.e., $279mv/R_{50}$.

The current supplied from terminal 413 will therefore also be $279mv/R_{50}$ which must be divided by about 110 before application as $I_{BIAS}$ to resistive element 50 to get the desired maximum 2.5mv drop thereacross.

This may be accomplished, for example, by application to the direct-coupled cascade connection of a current divider circuit 430, as described by A.A.A. Ahmed in U.S. Pat. No. 3,868,581 issued 25 Feb. 1975 and entitled "Current Amplifier", and a current-direction-reversing current mirror amplifier 440. Current divider circuit 430 comprises input terminal 431, output terminal 432, transistors 433-436 having respective base-emitter junctions of similar effective area, and transistors 437-439 having respective base-emitter junctions of similar effective area 2.4 times that of each of transistor 433-436. Current mirror amplifier 440 has an input terminal 441, an output terminal 442, matched transistors 443 and 444, and resistors 445 and 446 with respective resistances $R_{445}$ and $R_{446}$ that are equal. A variety of design variations are possible by varying the respective current gains of amplifiers 410 and 420 and using different current dividers of the sort described by Ahmed.

Figure 5:
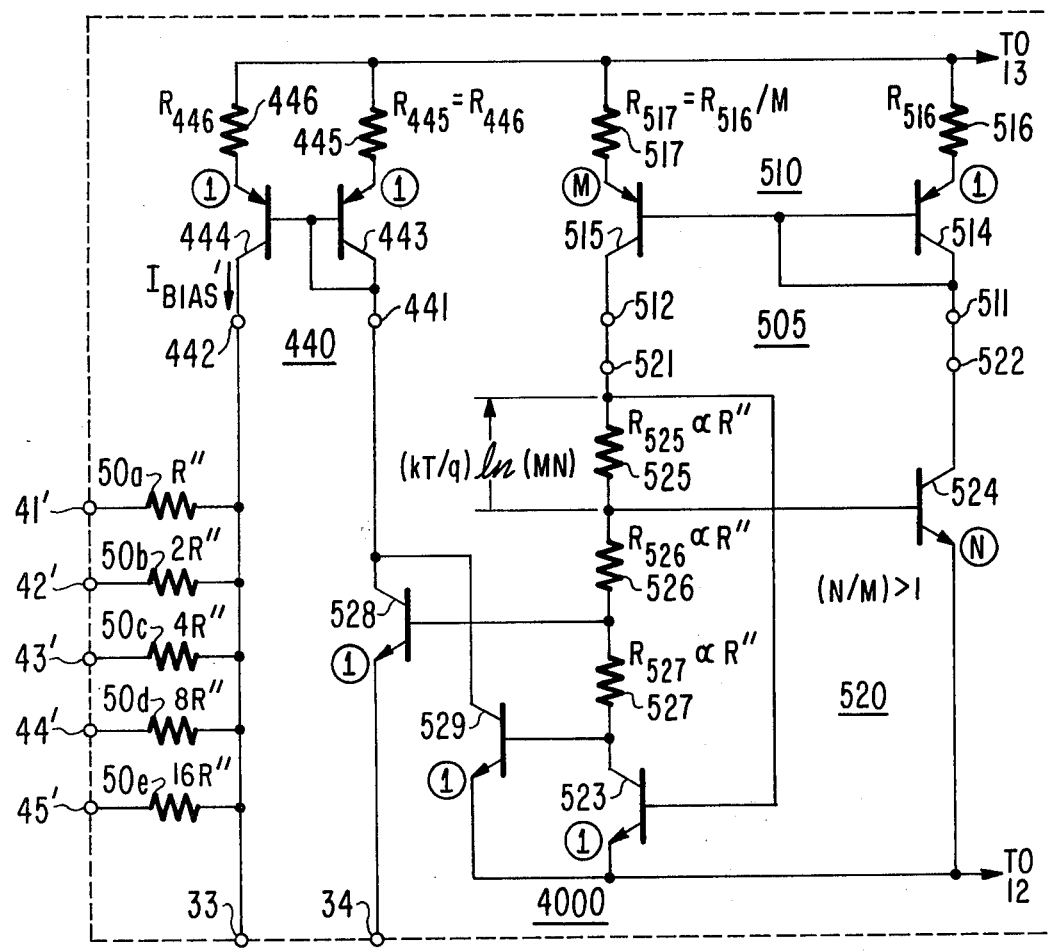

FIG. 5 shows a programmable voltage source 4000, a specific example of the type of source shown more generally in FIG. 2. Source 4000 includes a current regulating circuit 505 comprising the regenerative feedback loop connection of (a) a current mirror amplifier 510 exhibiting a current gain of $-M$ between its input terminal 511 and output terminal 512 and (b) a current amplifier 520 exhibiting a current gain between its input terminal 521 and output terminal 522 that decreases from an initial value of $-N$ as the level of its input current increases. This type of current regulating circuit is described by B. Crowle in U.S. patent application Ser. No. 646,954 filed 7 Jan. 1976 and entitled "Current Regulating Circuits". The open-loop gain at low current levels MW must exceed unity so the loop will strive for an equilibrium condition, in which condition the current gain of amplifier 520 is reduced to $-1/M$ with the potential drop across resistor 525 increased to $(kT/q)ln(MN)$. The best designs are where M = 1 and N substantially exceeds one.

The current flow through resistor 525, substantially equal to the collector current of transistor 523, is thus, by Ohm's Law, $(kT/q\ R_{525})ln(MN)$. Resistors 525, 526 and 527 have resistances $R_{525}$, $R_{526}$ and $R_{527}$, respectively, each operated at a temperature substantially equal to T, and each proportional to R". As described by Crowle, the collector current of transistor 529 and that of transistor 528 when terminal 34 at its emitter electrode is connected to terminal 12, are smaller than the collector current of transistor 523 by well-defined division factors that can be substantially large (e.g., 1000 and 100). For example, suppose M and N are made equal to 1 and 10, respectively, so $(kT/q)lnMN = 60$ mv. The collector current of transistor 523 is $60mv/R_{525}$. If $R_{525} = R_{526} = R_{527}$, the collector currents of transistors 528 and 529 will be $0.6mv/R_{525}$ and $0.06mv/R_{525}$, respectively, since each 60mv reduction of base-emitter potential between a first transistor and a second like it causes a ten times reduction in the collector current of the first compared to that of the second. If terminals 12 and 34 are connected, the combined collector currents of transistors 528 and 529 will be $0.66mv/R_{525}$ which inverted in CMA 440 will cause an $I'_{BIAS}$ of similar magnitude. When terminal 45' but not terminals 41', 42', 43' and 44' are connected to terminal 12, the condition for highest resistance connection between terminals 12 and 33, the potential between terminals 12 and 33 will be its maximum value, which by Ohm's Law is 0.66mv(16R''/$R_{525}$). If $R_{525}$ = 4R'', this potential is 2.64mv, as desired.

Considering operational amplifiers per FIG. 1 using the externally programmable current source per FIG. 3, one can select as premium units those IC's in which CMA 20 has substantially correct current gain. In the units so selected, optimum programming requires terminals 31 and 32 being connected directly to terminal 12 or one of the terminals 31 and 32 being connected to terminal 12 through the parallel connection of all of resistors 50a, 50b, 50c, 50d and 50e. Then, by opening the connection of terminal 34, the fineness of CMA gain adjustment can be increased by eleven times. (One may then introduce adjustable emitter degeneration resistance between terminals 12 and 33 adjustable over a range such that the maximum collector current of transistor 528 is no larger than that of transistor 529 to decrease any still remaining CMA current gain error, although this vernier will exhibit some temperature dependency.) As with programmable voltage sources of the type exemplified by source 400, considerable latitude exists in the design of a programmable voltage source of the type exemplified by source 4000.

Figure 6:
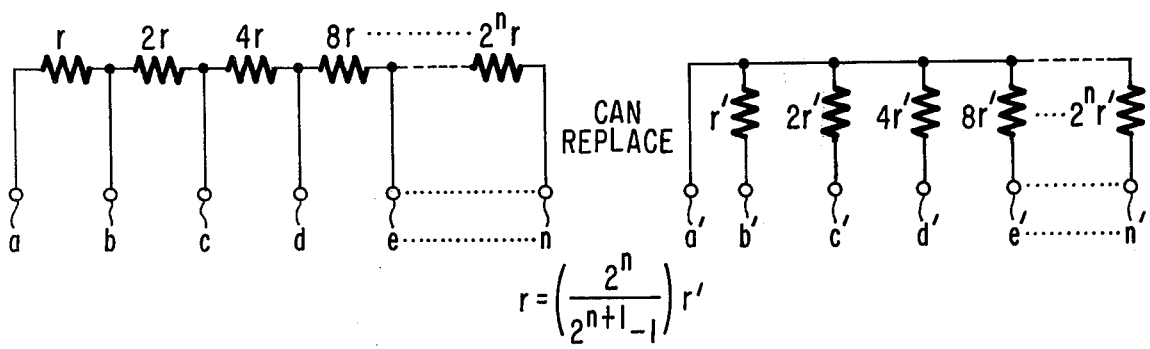
FIG. 6 is a diagram of equivalent structures for use in the programmable voltage source of FIGS. 2-5.

FIG. 6 shows at its left a series connection of selectively connectable resistors that may replace a network as shown at its right of selectively connectable resistors. Such a series connection might replace resistors 51–55, its terminals a and n being connected to different ones of connection 60 and terminal 12. Or such a series connection might replace resistors 50a, 50b, 50c, 50d, 50e, its terminals a and n being connected to different ones of terminals 12 and 30 to save need for one terminal. In either case, programming is no longer carried out solely by selective grounding of terminals in the selectably connectable resistor network, but rather by selective interconnection between terminals.

A variety of other modifications of the invention as thusfar described will readily occur to one skilled in IC circuit design and the scope of the claims should be determined accordingly. For example, independent programmable voltage sources for adjusting the potentials between terminal 12 and each of terminals 32 and 32 may be used together with a vernier adjustment circuit provided by a relatively high impedance potentiometer connected at its ends to terminals 31 and 32, respectively, and at its tap point to terminal 12. Another modification is one in which current sources 19 and 26 are caused to track current in current regulating circuit, so the current supplied by source 19 is proportional to T/$R_{50}$ or T/R'' to avoid the quiescent collector currents of transistors 16 and 17 introducing a small temperature dependency into the current gain of CMA 20. A variety of selectably connectable resistive networks other than those shown may be connected between terminals 31 and 32, receptive of single-ended or balanced programmed currents, for providing the programmed voltage source 40. CMA 20 may be modified, particularly as to the nature of the direct-coupled collector-to-base feedback connection of transistor 21.

The programmed resistances and the resistors having resistances tracking them in temperature may be formed by diffusion or ion-implantation in the monolithic integrated circuit die itself. Alternatively, the resistances may be evaporated or sputtered metal resistors formed on an outside surface of the monolithic integrated circuit die. The important thing is that the resistors be kept at substantially the same temperature as the transistors in the CMA one wishes to trim the current gain of.

Finally, the method by which programming the voltage source is carried out should be further considered. Programming can be carried out before the monolithic IC die is packaged (indeed, even before dicing and bonding operations, though this is less desirable). Such programming of terminal connections can be done by selective bonding, or by selective severing of metal interconnections. Another programming method is to place normally reverse-biased avalanche diodes between the points one might wish to connect, obtaining connection of any diode by applying forward current to heat the diode and cause aluminum metallization atop the diode to form permanently conductive spikes through the dioide which remain after normal bias conditions are re-established. Bonding and packaging of monolithic IC's does result in mechanical stresses on the CMA transistors that can effect their transconductances and thus affect CMA current gain, and programming by selective pin connection after packaging is attractive in ultra-high precision units.

What is claimed is:

1. A current mirror amplifier including:
    an input terminal for receiving an input current;
    an output terminal;
    first and second transistors, each having base and emitter and collector electrodes and being operated within the confines of an integrated circuit at an absolute temperature substantially equal to T;
    first conductive means connecting the collector electrode of said first transistor to said input terminal;
    second conductive means connecting the collector electrode of said second transistor to said output terminal;
    a collector-to-base feedback connection between the collector and base electrodes of said first transistor for adjusting the base potential of said first transistor to condition said first transistor to conduct as collector current substantially all of said input current; and
    means for applying substantially the same potential to the base electrode of said second transistor as said collector-to-base feedback connection applies to the base electrode of said first transistor, said current mirror amplifier having in combination therewith, means for adjusting its current gain to values substantially independent of T, which means for adjusting its current gain consists of:
    a source of adjustable offset voltage proportional to T applied between the emitter electrodes of said first and said second transistor.

2. An adjustable current mirror amplifier as set forth in claim 1 wherein said source of adjustable offset voltage proportional to T includes:
    a first resistive element operated at an absolute temperature substantially equal to T, and connected between the emitter electrodes of said first and said second transistors, said first resistive element having a resistance $R_{50}$;
    a plurality of further resistive elements selectively connectable between first and second terminals, each of said further resistive elements operated at an absolute temperature substantially equal to T, each of said further resistive elements having a resistance proportional to R;

means for applying a potential between said first and said second terminals which potential is proportional to $TR/R_{50}$; and means responsive to the resultant current flow between said first and said second terminals for causing a proportionally related current flow through said first resistive element.

3. An adjustable current mirror amplifier as set forth in claim 1 wherein said source of adjustable offset voltage proportional to T includes:

a plurality of resistive elements selectively connectable between the emitter electrodes of said first and said second transistors, each of said resistive elements being operated at an absolute temperature substantially equal to T, each of said resistive elements having a resistance proportional to R';

a current supply connected between the emitter electrodes of said first and said second transistors to cause a current flow to the network between them, which current supply supplies a current proportional to T/R'.

4. A current mirror amplifier including:

an input terminal for receiving an input current;

an output terminal;

first and second transistors, each having base and emitter and collector electrodes and being operated at an absolute temperature substantially equal to T;

first conductive means connecting the collector electrode of said first transistor to said input terminal;

second conductive means connecting the collector electrode of said second transistor to said output terminal;

a collector-to-base feedback connection between the collector and base electrodes of said first transistor for adjusting the base potential of said first transistor to condition said first transistor to conduct as collector current substantially all of said input current; and means for applying substantially the same potential to the base electrode of said second transistor as said collector-to-base feedback connection applies to the base electrode of said first transistor; and means for adjusting the gain of said current mirror amplifier as between its input and output terminals, which means consists of means for adjusting, independently of the current flow through the respective emitter-to-collector paths of said first and second transistors, the potential between the emitter electrodes of said first and said second transistors.

5. A current mirror amplifier as set forth in claim 4 wherein said means for adjusting the potential between the emitter electrodes of said first and said second transistors comprises means for adjusting said potential between the emitter electrodes of said first and said second transistors in discrete steps.

6. A current mirror amplifier as set forth in claim 5 wherein said means for adjusting the potential between the emitter electrodes of said first and said second transistors comprises means for applying potentials between said emitter electrodes which is proportional to T.

7. A current mirror amplifier as set forth in claim 4 wherein said means for adjusting comprises resistance means connected between said emitter electrodes of said first and second transistors, said resistance means having a resistance value which is much lower than the resistance looking into the emitter electrodes of said transistors, and means external of said first and said second transistors for applying a current through said resistance means, said means external of said transistors including means for adjusting said current to a desired value.

8. A current mirror amplifier as set forth in claim 4 wherein said means for adjusting the potential between the emitter electrodes of said first and said second transistors comprises:

first resistance means having a resistance $R_{50}$ connected between the emitter electrodes of said first and said second transistors and operated at an absolute temperature sustantially equal to T;

programmable second resistance means having a resistance proportional to R and being operated at an absolute temperature substantially equal to T;

a controlled current source connected across said programmable second resistance, for causing a potential drop to appear across said programmable second resistance responsive to the controlled current;

a source of reference potential proportional to $TR/R_{50}$;

means for comparing the potential drop across said programmable second resistance to said reference potential to generate a control signal proportional to their difference applied to control the current supplied by controlled current source, thereby completing a degenerative feedback loop adjusting the potential drop across said programmable second resistances to equal said reference potential;

means for sensing the controlled current applied to said programmable second resistance and applying a proportionally related current to said first resistance means.

9. A current mirror amplifier as set forth in claim 8 wherein said first resistance means comprises another programmable resistance means.

* * * * *